United States Patent
Tanabe et al.

(10) Patent No.: US 7,449,076 B2
(45) Date of Patent: Nov. 11, 2008

(54) PUNCHED ADHESIVE TAPE FOR SEMICONDUCTOR, METHOD OF MANUFACTURING LEAD FRAME WITH THE ADHESIVE TAPE, LEAD FRAME WITH THE ADHESIVE TAPE, AND SEMICONDUCTOR DEVICE COMPRISING THE LEAD FRAME

(75) Inventors: Yoshiyuki Tanabe, Chiba (JP); Yoshihiro Nomura, Ichihara (JP); Hiroshi Kirihara, Ichihara (JP); Youichi Hosokawa, Ichihara (JP); Shinji Iioka, Ichihara (JP); Satoru Yanagisawa, Ichihara (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 135 days.

(21) Appl. No.: 11/241,992

(22) Filed: Oct. 4, 2005

(65) Prior Publication Data

US 2006/0027312 A1    Feb. 9, 2006

Related U.S. Application Data

(60) Division of application No. 10/246,620, filed on Sep. 19, 2002, now Pat. No. 7,273,654, which is a continuation of application No. 09/462,943, filed as application No. PCT/JP98/03072 on Jul. 9, 1998, now Pat. No. 6,523,446.

(30) Foreign Application Priority Data

Jul. 18, 1997    (JP)    ................................... 9-193637

(51) Int. Cl.
*B32B 41/00*    (2006.01)

(52) U.S. Cl. .......................... 156/64; 156/252; 156/256; 156/269

(58) Field of Classification Search .................. 156/64, 156/353, 361, 378, 379, 252, 256, 259
See application file for complete search history.

(56) References Cited

U.S. PATENT DOCUMENTS 4,472,922 A    9/1984 Romagnoli
(Continued)

FOREIGN PATENT DOCUMENTS

JP    57138151    8/1982
(Continued)

OTHER PUBLICATIONS

English translation of UM 0122305, Duk-Kee Lee, "An Adhesive Tape for a Lead-on-chip and Chip-on-Lead of One United Body Type and An Apparatus for Attaching the Same" May 8, 1998.

*Primary Examiner*—George R Koch, III
(74) *Attorney, Agent, or Firm*—Antonelli, Terry, Stout & Kraus, LLP.

(57) ABSTRACT

A punched adhesive tape for semiconductor which is made by punching an adhesive tape comprising a base film and an adhesive layer provided on one or each side of the base film to mark the regions in the adhesive tape where contaminants or defects are contained; a method of producing an adhesive tape-bearing lead frame by punching the punched adhesive tape for semiconductor, with the parts containing the punched holes skipped over, and applying the adhesive tape pieces punched out from the punched adhesive tape for semiconductor to a lead frame; a semiconductor device fabricated by using the adhesive-bearing lead frame.

2 Claims, 1 Drawing Sheet

U.S. PATENT DOCUMENTS

| | | | |
|---|---|---|---|
| 4,547,250 A | * | 10/1985 | Murayama ................ 156/384 |
| 4,804,434 A | | 2/1989 | von Kraewel |
| 5,277,972 A | | 1/1994 | Sakumoto et al. |
| 5,432,380 A | | 7/1995 | Jin et al. |
| 5,614,274 A | | 3/1997 | Huss |
| 5,641,714 A | | 6/1997 | Yamanaka |
| 5,691,023 A | | 11/1997 | Keller |
| 5,725,948 A | | 3/1998 | Oka et al. |
| 5,874,009 A | | 2/1999 | Inada et al. |
| 6,012,502 A | * | 1/2000 | VanNortwick et al. ...... 156/518 |

FOREIGN PATENT DOCUMENTS

| | | |
|---|---|---|
| JP | 58160873 | 9/1983 |
| JP | 1214036 | 8/1989 |
| JP | 3000228 | 1/1991 |
| JP | 337555 | 2/1991 |
| JP | 3104249 | 5/1991 |
| JP | 3129841 | 6/1991 |
| JP | 421104 | 5/1992 |
| JP | 6003283 | 1/1994 |
| JP | 6334110 | 12/1994 |
| JP | 6342869 | 12/1994 |
| JP | 9092692 | 4/1997 |
| JP | 63288038 | 11/1998 |
| JP | 11074412 | 3/1999 |
| JP | 11274246 | 10/1999 |
| JP | 266688 | 9/2000 |
| KR | 0122305 | 5/1998 |

* cited by examiner

PUNCHED ADHESIVE TAPE FOR SEMICONDUCTOR, METHOD OF MANUFACTURING LEAD FRAME WITH THE ADHESIVE TAPE, LEAD FRAME WITH THE ADHESIVE TAPE, AND SEMICONDUCTOR DEVICE COMPRISING THE LEAD FRAME

This application is a Divisional Application of Ser. No. 10/246,620, filed Sep. 19, 2002, now U.S. Pat. No. 7,273,654, which is a Continuation Application of application Ser. No. 09/462,943, filed Jan. 18, 2000, now U.S. Pat. No. 6,523,446, which is a national stage application filed under 35 USC 371 of International Patent Application (PCT) No. PCT/JP98/03072, filed Jul. 9, 1998.

TECHNICAL FIELD

The present invention relates to punched adhesive tapes for semiconductor particularly suitable for use in semiconductor devices wherein semiconductor elements (chips) are bonded to lead frames, and also relates to the production of adhesive tape-bearing lead frames, to adhesive tape-bearing lead frames and to semiconductor devices fabricated using the adhesive tape-bearing lead frames.

BACKGROUND ART

In resin-molded semiconductor devices, adhesive tapes are now mainly used as the adhesives for bonding semiconductor elements (chips) to lead frames.

If the adhesive tapes used for the above purpose contain contaminants or defects, the reliability of semiconductor devices may be lowered. It is therefore necessary to inspect adhesive tapes for contaminants and defects before applying the adhesive tapes to adherend lead frames, to avoid using adhesive tapes containing contaminants or defects.

A conventional, simple method of removing contaminants is to cut off the parts containing contaminants from adhesive tapes, to obtain contaminants free adhesive tapes. This method however requires many hands and is inefficient.

According to an alternative for preventing contamination, the regions containing contaminants are marked with seals, ink or the like, to avoid these regions and use other regions for bonding. This method also needs improvement since the adhesive tapes may be contaminated by the marking, causing the contamination of adherend chips.

DISCLOSURE OF INVENTION

The object of the present invention is to solve the above problems and to provide an adhesive tape for semiconductor which is excellent in work efficiency, a method of producing an adhesive tape-bearing lead frame using the same, an adhesive tape-bearing lead frame, and a semiconductor device fabricated by using the same. As a result of study to prevent contamination without cutting adhesive tapes nor contaminating them by marking with seals or ink, we have hit upon an idea that punching adhesive tapes at or in the vicinity of the regions containing contaminants or defects is excellent in work efficiency and overcomes the above problems, and we have consequently completed the present invention.

That is, the present invention provides a punched adhesive tape for semiconductor, which is made of an adhesive tape comprising a base film and an adhesive layer provided on one or each side of the base film, and is pierced with at least one punched hole which is made by punching the adhesive tape at or in the vicinity of a region where the adhesive tape contains a contaminant or a defect.

The punched adhesive tape for semiconductor of the present invention is suitable particularly for bonding semiconductor chips to lead frames, and also has various other uses in the fabrication of semiconductor devices, for example, to bond semiconductor chips to TAB tapes.

The present invention further provides a method of producing an adhesive tape-bearing lead frame, comprising detecting the punched hole in the punched adhesive tape for semiconductor, punching the punched adhesive tape for semiconductor, with a part thereof containing the punched hole skipped over, to punch out an adhesive tape piece from the punched adhesive tape for semiconductor, applying the adhesive tape piece to a lead frame, with one adhesive layer of the adhesive tape piece adhering to the lead frame.

The present invention further provides an adhesive tape-bearing lead frame produced by the above-described method.

The present invention further provides a semiconductor device fabricated by using the adhesive tape-bearing lead frame.

BEST MODE FOR CARRYING OUT THE INVENTION

Figure 1:
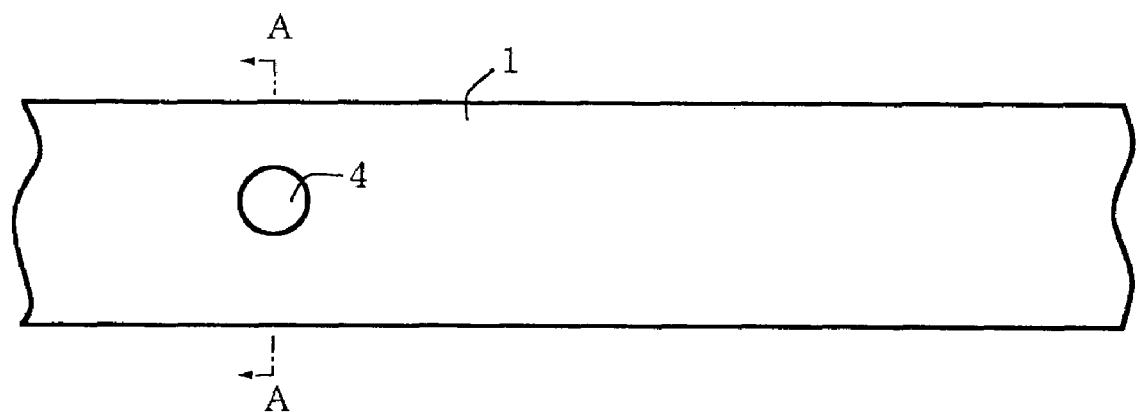
FIG. 1 is a plan view of a punched adhesive tape for semiconductor of an embodiment according to the present invention.

Hereinafter the punched adhesive tape for semiconductor of the present invention and the adhesive tape-bearing lead frame produced using the same will be described in detail.

Exemplary films usable as the base film in the present invention include insulating heat resistant resin films, such as polyimide films, polyether-amide films, polyether-amide-imide films, polyether-sulfone films, polyether-ether-ketone films and polycarbonate films. The base film is preferably transparent. The thickness of the base film is preferably 5 to 200 µm, more preferably 25 to 50 µm. Base films thicker than 200 µm are disadvantageous to the production of thin resin-molded semiconductor devices, and base films thinner than 5 µm may lower the work efficiency in adhesive coating.

Non-limitative examples of adhesives usable to form the adhesive layer of the punched adhesive tape for semiconductor of the present invention include adhesives comprising thermoplastic resins, such as aromatic polyamides, aromatic polyesters, aromatic polyimides, aromatic polyethers, aromatic polyether-amide-imides, aromatic polyester-imides and aromatic polyether-imides, and adhesives comprising thermosetting resins, such as acrylic resins, epoxy resins and phenolic resins.

The thickness of each adhesive layer of the punched adhesive tape for semiconductor of the present invention is generally 1 to 100 µm, preferably 5 to 50 µm, more preferably 10 to 25 µm.

For example, the adhesive tape to be used in the present invention for the production of the punched adhesive tape for semiconductor is produced by coating one or both sides of a base film with a varnish of an adhesive dissolved in a solvent, and heating the coating to dry by removing the solvent, to form an adhesive layer on one or each side of the base film. Adhesives comprising thermosetting resins are preferably semi-cured, generally to B-stage, by the drying. The adhesive layer is preferably transparent.

The adhesive tape may be provided with a peelable, transparent protection film, such as polytetrafluoroethylene film, polyethyleneterephthalate film, release-treated polyethyleneterephthalate film, polyethylene film polypropylene film or polymethylpentene film, on one or both adhesive layers. Adhesive tapes provided with protection films may be punched together with the protection films, or may be punched after the protection films are peeled off. The thickness of the protection film is preferably 5 to 100 μm, more preferably 10 to 50 μm.

The punching for making the punched holes piercing the punched adhesive tape for semiconductor of the present invention may be carried out by any method, for example by using a punching machine comprising a tape-punching die and an air press capable of reciprocating the die. Contaminants and defects contained in the adhesive tape are removed by punching the adhesive tape at the regions each containing a contaminant or a defect. However, it is not always necessary to punch out each contaminant or defective part completely so far as a region which contains a part of the contaminant or defect or is close to the contaminant or defect is punched out. Even in such cases, adhesive tape pieces free of contaminants and defects can be obtained by punching the punched adhesive tape for semiconductor, skipping over the punched holes and the neighborhood. When a punched hole is made in the vicinity of a region containing a contaminant or a defect, the distance between the center of the punched hole and the region containing a contaminant or a defect is preferably 10 cm or less, more preferably 5 cm or less.

Herein, the term "contaminant" means a substance other than the materials of the adhesive layer and of the base film, which lowers the reliability of semiconductor devices, such as a fine particle of a conductive substance and a dust particle, and the term "defect" means the part lacking the adhesive layer, the part where the thickness of the adhesive layer is not uniform, or the like, which causes bonding failure.

The form of the punched hole is not limited, and is preferably circular. The punched hole may be of any size which does not cut the adhesive film. Preferred punched holes are circular holes of 0.5 to 10 mm, more preferably 2 to 5 mm in diameter. Punched holes having a diameter of more than 10 mm may lower the tensile strength of the adhesive tape, causing break during practical use. Punched holes of less than 0.5 mm in diameter are difficult to make.

Punching adhesive tapes at the regions containing contaminants or defects allows using long adhesive tapes as they are since contaminants and defects can be removed without cutting the adhesive tapes. A contamination inspection apparatus comprised of an adhesive tape-unwinding part, a CCD camera (charge-coupled device camera), a punching part and an adhesive tape-winding part enables a continuous process comprising unwinding an adhesive tape continuously from the adhesive tape-unwinding part, inspecting the appearance of the fed adhesive tape with the CCD camera, slowing down the adhesive tape to stop it upon the detection of a contaminant or a defect, punching the region containing the contaminant or defect to make a punched hole at the punching part, resuming unwinding, and finally winding the punched adhesive tape.

Figure 2:
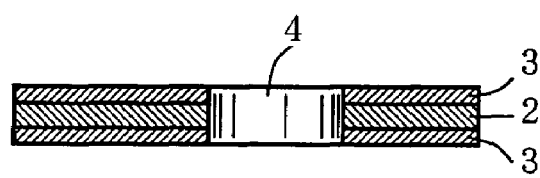
FIG. 2 is an expanded cross-sectional view of the punched adhesive tape for semiconductor as shown in FIG. 1 taken in the direction of arrows A-A.

FIG. 1 is a plan view of a punched adhesive tape for semiconductor of an embodiment according to the present invention, and FIG. 2 is an expanded cross-sectional view of the punched adhesive tape for semiconductor as shown in FIG. 1 taken in the direction of arrows A-A. As shown in these figures, a punched adhesive tape for semiconductor (1) consisting of a base film (2) and two adhesive layers (3, 3) provided, respectively, on each side of the base film (2) is pierced with a circular punched hole (4), which is made by punching. The region of the material adhesive tape where a contaminant or a defect was contained has been removed by punching the punched hole (4).

According to the method of the present invention, an adhesive tape-bearing lead frame is produced by detecting the punched hole in the punched adhesive tape for semiconductor of the present invention, punching the punched adhesive tape for semiconductor, with a part thereof containing the punched hole skipped over, to punch out an adhesive tape piece from the punched adhesive tape for semiconductor, applying the adhesive tape piece to a lead frame, with one adhesive layer of the adhesive tape piece adhering to the lead frame.

The lead frame to be used in the method of the present invention is not limited in structure, and examples of usable lead frames include those for the use in COL (Chip on Lead) and LOC (Lead on Chip) semiconductor devices. Exemplary materials of the lead frame include 42 alloy and copper alloy. The lead frame typically comprises inner leads, outer leads and bus bars, and one or more adhesive tape pieces may be applied to any position selected depending on the structure of the lead frame and on the adherend, and when used to bond semiconductor chips, depending on the shapes of the semiconductor chips, the pad array on the chips, the design of the lead frame, etc.

The punched adhesive tape for semiconductor to be used in this method preferably has an adhesive layer on each side of the base film. When an adhesive film having only one adhesive layer is used, an adhesive layer need be formed on the base film of the adhesive tape piece applied on the lead frame, for example, by coating an adhesive, to bond semiconductor chips thereon.

When the punched adhesive tape for semiconductor is provided with one or two protection films, the protection film on the adhesive layer which adheres to the lead frame need be peeled off before punching. The protection film provided on the other side may be peeled off either before punching, or after punching and applying and before bonding adherend, such as semiconductor chips.

The form of the adhesive tape piece punched out from the punched adhesive tape for semiconductor depends on the structure of the lead frame and on the adherend to be bonded to the lead frame. For example, when the adherend is a semiconductor chip, the form of the adhesive tape piece depends on the shape of the semiconductor chip, the pad array on the semiconductor chip, the design of the lead frame, or the like.

When the adhesive tape piece is applied to the lead frame, the lead frame is generally heated to 150 to 450° C. When the adhesive layers are thermosetting adhesive layers, at least the adhesive layer which does not contact the lead frame must not be completely cured but need remain semi-cured. If completely cured, the adhesive layer cannot bond adherend semiconductor chips any longer.

Preferably, the method of the present invention for producing an adhesive tape-bearing lead frame by using a punched adhesive tape for semiconductor is carried out by employing a common process for applying adhesive tapes to lead frames which comprises unwinding an adhesive tape, punching the adhesive tape (to punch out an adhesive tape piece to be applied to a lead frame), applying the adhesive tape piece, and winding the punched adhesive tape, and by adding thereto a step of detecting punched holes prior to the punching of the adhesive tape piece. The detection of punched holes can be carried out visually, but preferably by using a CCD camera, which permits automatic detection and improves the work efficiency.

By winding (skipping) the punched adhesive tape for semiconductor a certain length, for example ±20 cm, preferably ±10 cm from the center of each punched hole in the direction of the length of the punched adhesive tape for semiconductor without punching the regions containing the detected punched holes, it can be prevented to apply adhesive tape pieces containing contaminants or defects to lead frames. Further, since the regions of the material adhesive tape where contaminants or defects are contained are marked by punching, there is no fear of contaminating semiconductor chips due to external causes, for example, due to the marking of contaminants and defects with seals or ink. The method of the present invention also reduces the work time since it permits using long adhesive tapes as they are without cutting, thereby reducing the number of the exchanges of adhesive tapes during the work for applying adhesive tape pieces. That is, according to the method of the present invention, adhesive tape-bearing lead frames can be produced efficiently with good yield.

The obtained adhesive tape-bearing lead frame has an advantage of low production cost since the use of the punched adhesive tape for semiconductor of the present invention improves the work efficiency, yield and productivity in the production of the adhesive tape-bearing lead frame. Also, the adhesive tape-bearing lead frame can decrease defects in the semiconductor devices produced using them, reducing the production cost.

Figure 3:
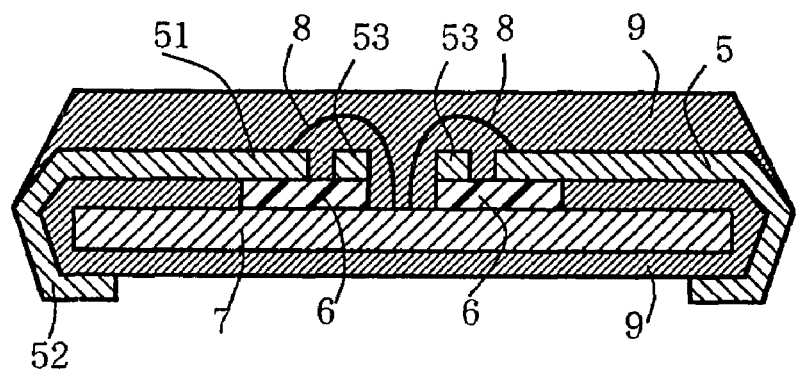
FIG. 3 is a cross-sectional view of a semiconductor device of an embodiment according to the present invention.

The semiconductor device of the present invention has no limitation in its structure so far as it is fabricated by using the adhesive tape-bearing lead frame of the present invention. FIG. 3 is a cross-sectional view of a semiconductor device of an embodiment according to the present invention, wherein the semiconductor chip (7) is mounted on the lead frame (5) comprising inner leads (51), outer leads (52) and bus bars (53). The inner leads (51) are connected with the die pads of the semiconductor chip (7) by, for example, gold wires (8). The semiconductor device is molded with the sealing material (9). The semiconductor chip (7) is bonded to the lead frame (5) by the adhesive tape piece (6) by using an adhesive tape-bearing lead frame which consists of the lead frame (5) and the adhesive tape piece (6) applied thereto.

For example, the semiconductor device of the present invention is produced by bonding with heat and pressure a semiconductor chip to the adhesive tape piece applied to the adhesive tape-bearing lead frame of the present invention, curing (C-stage) the adhesive layers when the adhesive layers are made of thermosetting resin adhesives, connecting the inner leads of the lead frame with the die pads of the semiconductor chip by wire bonding, followed by molding with a sealing material, such as an epoxy resin sealing material.

The present invention will be described in more detail with reference to the following Examples, which, however, are not to be construed to limit the scope of the invention.

EXAMPLE 1

An adhesive tape (trade name: HM-122U, produced by Hitachi Chemical Company, Ltd., a three-layered adhesive tape: adhesive layer 25 μm thick (an aromatic polyether-amide-imide)/base film 50 μm thick (a polyimide film)/adhesive-layer 25 μm thick (an aromatic polyether-amide-imide)) 10 m long by 9 mm wide was subjected to an appearance inspection using a contaminant (defect) inspector (trade name: SCANTEC-5000, produced by Nagase Sangyo Co., Ltd.), which consists of an adhesive tape-unwinding part, a CCD camera (trade name: TECEYE T15000H, produced by Excel Co., Ltd.), a punching part and an adhesive tape-winding part. In the course of the inspection, the contaminated or defective parts detected by the CCD camera or the neighborhoods thereof were punched out (punched hole: a circular hole of 3 mm in diameter) at the punching part. Thus a punched adhesive tape for semiconductor 10 m long was obtained without cutting the adhesive tape.

EXAMPLE 2

An adhesive tape (trade name: HM-122U, produced by Hitachi Chemical Company, Ltd.) 50 m long by 9 mm wide was subjected to an appearance inspection using a contaminant (defect) inspector consisting of an adhesive tape-unwinding part, a CCD camera, a punching part and an adhesive tape-winding part. In the course of the inspection, the contaminated or defective parts detected by the CCD camera or the neighborhoods thereof were punched out (punched hole: a circular hole of 3 mm in diameter) at the punching part. Thus a punched adhesive tape for semiconductor 50 m long was obtained without cutting the adhesive tape.

EXAMPLE 3

An adhesive tape (trade name: HM-122U, produced by Hitachi Chemical Company, Ltd.) 300 m long by 9 mm wide was subjected to an appearance inspection using a contaminant (defect) inspector consisting of an adhesive tape-unwinding part, a CCD camera, a punching part and an adhesive tape-winding part. In the course of the inspection, the contaminated or defective parts detected by the CCD camera or the neighborhoods thereof were punched out (punched hole: a circular hole of 3 mm in diameter) at the punching part. Thus a punched adhesive tape for semiconductor 300 m long was obtained without cutting the adhesive tape.

EXAMPLE 4

Using the punched adhesive tape for semiconductor produced in Example 1, an adhesive tape-bearing lead frame was produced as follows. A 42 alloy lead frame comprising inner leads, outer leads and bus bars was used, and adhesive tape pieces (1 mm×6 mm) were applied to the inner leads and bus bars by a continuous process comprising unwinding the adhesive tape, detecting punched holes, punching out adhesive tape pieces, applying them to the lead frame, and winding the adhesive tape, wherein the adhesive tape pieces punched out from the adhesive tape for semiconductor were applied to the lead frame by pressing them to the lead frame at 400° C. for 3 seconds under a pressure of 3 MPa. The detection of punched holes were carried out using a CCD camera, and on detection of each punched hole, the adhesive tape was wound by 10 cm in the direction of length without punching, to avoid punching a part of a length of ±5 cm from the center of the punched hole in the direction of the length of the adhesive tape, and to avoid applying the part to the lead frame. When all the adhesive tape pieces which were applied in sequence to the lead frame were inspected, no contaminants nor defects were observed.

EXAMPLE 5

Semiconductor chips (6.6 mm×15 mm×0.28 mm) were bonded to the adhesive tape-bearing lead frame produced in Example 4 on its side bearing the adhesive tape pieces by pressing for 3 seconds at 350° C. under a pressure of 3 MPa. When the inner leads and the semiconductor chips were connected by wire bonding, no problem occurred. Then moldings with an epoxy resin sealing material (Trade name: CEL-920, produced by Hitachi Chemical Company, Ltd.) were carried out to produce semiconductor devices. After a moisture absorption test for 168 hours at 85° C. at a relative humidity of 85% followed by a reflow test in an IR furnace of a maximum temperature of 245° C., all the semiconductor devices worked properly without any malfunction.

COMPARATIVE EXAMPLE 1

An adhesive tape (trade name: HM-122U, produced by Hitachi Chemical Company, Ltd.) of 10 m long by 9 mm wide was subjected to an appearance inspection using a contaminant (defect) inspector consisting of an adhesive tape-unwinding part, a CCD camera and an adhesive tape-winding part. In the course of the inspection, each time a contaminant or a defect was detected, the adhesive tape was cut off to remove a part of 20 to 30 cm long containing the contaminant or defect. Thus two adhesive tapes for semiconductor of 3 m and 6.7 m in length were obtained.

COMPARATIVE EXAMPLE 2

An adhesive tape (trade name: HM-122U, produced by Hitachi Chemical Company, Ltd.) 50 m long by 9 mm wide was subjected to an appearance inspection using a contaminant (defect) inspector consisting of an adhesive tape-unwinding part, a CCD camera and an adhesive tape-winding part. In the course of the inspection, each time a contaminant or a defect was detected, the adhesive tape was cut off to remove a part of 20 to 30 cm long containing the contaminant or defect. Thus three 10 m-rolls, two 7 m-rolls and one 5 m-roll of adhesive tapes for semiconductor were obtained.

COMPARATIVE EXAMPLE 3

An adhesive tape (trade name: HM-122U, produced by Hitachi Chemical Company, Ltd.) 300 m long by 9 mm wide was subjected to an appearance inspection using a contaminant (defect) inspector consisting of an adhesive tape-unwinding part, a CCD camera and a tape winding part. In the course of the inspection, each time a contaminant or a defect was detected, the adhesive tape was cut off to remove a part of 20 to 30 cm long containing the contaminant or defect. Thus three 50 m-rolls, four 20 m-rolls, five 7 m-rolls and six 5 m-rolls of adhesive tapes for semiconductor were obtained.

As to the adhesive tapes for semiconductor produced in Examples 1 to 3 and Comparative Examples 1 to 3, the number of punched holes, the length per roll, the total length, the percentage of the tape loss upon applying them to lead frames, and the number of exchanges of adhesive tapes during applying them to lead frames are shown in Table 1.

TABLE 1

| | Number of punched holes | Length/roll | Tape loss (%)*/roll | Number of exchanges of adhesive tapes |
|---|---|---|---|---|
| Example 1 | 1 | 10 m | 15 | once/10 m |
| Comp. Example 1 | 0 | 3 m (1 roll) | 50 | twice/10 m |
| | | 6.7 m (1 roll) | 22 | |
| | | Total: 9.7 m | | |
| Example 2 | 5 | 50 m | 3 | once/50 m |

TABLE 1-continued

| | Number of punched holes | Length/roll | Tape loss (%)*/roll | Number of exchanges of adhesive tapes |
|---|---|---|---|---|
| Comp. Example 2 | 0 | 10 m (3 rolls) | 15 | six times/50 m |
| | | 7 m (2 rolls) | 21 | |
| | | 5 m (1 roll) | 30 | |
| | | Total: 49 m | | |
| Example 3 | 17 | 300 m | 0.5 | once/300 m |
| Comp. Example 3 | 0 | 50 m (3 rolls) | 3 | 18 times/300 m |
| | | 20 m (4 rolls) | 7.5 | |
| | | 7 m (5 rolls) | 21 | |
| | | 5 m (6 rolls) | 30 | |
| | | Total: 295 m | | |

*A tape loss of 1.5 m/roll in total of the lengths from both ends of each adhesive tape was caused by setting the adhesive tape to the production apparatus.

Table 1 clearly shows that making punched holes in a material adhesive tape permits using an adhesive tape in good yield and improves work efficiency, compared with cutting the material adhesive tape.

INDUSTRIAL APPLICABILITY

Because the punched adhesive tape for semiconductor of the present invention is having contaminants and defects marked by punching, detecting the punched holes can prevent such defective parts of the adhesive tape from being applied to lead frames. Also there is no external factors of chip contamination, which are inherent in the conventional method of marking contaminants and defects with seals or ink. Further, the punched adhesive tape for semiconductor reduces the work time since it enables using long adhesive tapes as they are without cutting, thereby decreasing the number of the exchanges of adhesive tapes during the work for applying adhesive tapes. That is, by using the punched adhesive tape for semiconductor of the present invention, adhesive tape pieces can be applied to lead frames with high work efficiency and good yield.

Also the cost of producing the adhesive tape-bearing lead frame of the present invention using the punched adhesive tape for semiconductor is advantageously low since the adhesive tape-bearing lead frame can be produced efficiently with good yield and high productivity. Further, the adhesive tape-bearing lead frame reduces the malfunction of the semiconductor devices fabricated by using it, thereby lowering the production cost.

The invention claimed is:

1. A method for making an adhesive tape-bearing lead frame for fabricating semiconductor devices, comprising:
   providing a roll of adhesive tape, the adhesive tape comprising a base film, an adhesive layer provided on at least one side of the base film, and at least one hole punched completely through the base film and the adhesive layer at or in a vicinity of a region at which a contaminant or a defect had been detected, the adhesive tape being wound into a roll;
   unwinding the adhesive tape from the roll;
   inspecting the unwound adhesive tape for punched holes;
   cutting a length of adhesive tape having no punched holes therein; and
   adhering the adhesive layer of the cut length of adhesive tape to a lead frame.

2. The method for making an adhesive tape-bearing lead frame for fabricating semiconductor devices according to claim 1, wherein the providing the roll of adhesive tape comprises:
- providing an adhesive tape comprising a base film and an adhesive layer provided on at least one side of the base film;
- inspecting the adhesive tape for at least one of contaminants and defects;
- punching at least one hole completely through the base film and the adhesive layer at or in a vicinity of a region at which a contaminant or a defect is detected; and
- winding the adhesive tape having at least one hole punched completely through the base film and the adhesive layer into a roll.

* * * * *